United States Patent
Lee et al.

(10) Patent No.: US 10,712,616 B1
(45) Date of Patent: Jul. 14, 2020

(54) LIQUID CRYSTAL DISPLAY DEVICE COMPRISING FIRST AND SECOND LIQUID CRYSTAL DISPLAY PANELS RESPECTIVELY HAVING FIRST AND SECOND LIQUID CRYSTAL RETARDATIONS AND A COLOR CONVERSION LAYER

(71) Applicant: a.u. Vista, Inc., Milpitas, CA (US)

(72) Inventors: Seok-Lyul Lee, Hsinchu (TW); Fang-Chen Luo, Milpitas, CA (US); Adiel Abileah, Milpitas, CA (US); Willem den Boer, Milpitas, CA (US); Tai Kang Wu, Hsinchu (TW)

(73) Assignee: A.U. Vista, Inc., Milpitas, CA (US)

( * ) Notice: Subject to any disclaimer, the term of this patent is extended or adjusted under 35 U.S.C. 154(b) by 0 days.

(21) Appl. No.: 16/653,332

(22) Filed: Oct. 15, 2019

(51) Int. Cl.
| G02F 1/13357 | (2006.01) |
| G02F 1/1335 | (2006.01) |
| G02F 1/1347 | (2006.01) |
| H01L 33/50 | (2010.01) |
| G02F 1/017 | (2006.01) |

(52) U.S. Cl.
CPC ...... G02F 1/133617 (2013.01); G02F 1/1347 (2013.01); G02F 1/133514 (2013.01); G02F 1/133528 (2013.01); H01L 33/50 (2013.01); G02F 1/133603 (2013.01); G02F 2001/01791 (2013.01); G02F 2001/133614 (2013.01); G02F 2202/36 (2013.01)

(58) Field of Classification Search
CPC ............. G02F 1/133617; G02F 1/1347; G02F 2202/36
See application file for complete search history.

(56) References Cited

U.S. PATENT DOCUMENTS

| 7,705,933 | B2 | 4/2010 | Matushima | |
| 9,977,273 | B2 | 5/2018 | Wei | |
| 10,139,679 | B2 | 11/2018 | Yang et al. | |
| 2007/0104895 | A1* | 5/2007 | Hotaka | G02F 1/133723 428/1.1 |
| 2008/0018832 | A1* | 1/2008 | Lee | G02B 5/3058 349/96 |
| 2010/0128205 | A1* | 5/2010 | Rho | B82Y 20/00 349/96 |
| 2017/0045778 | A1* | 2/2017 | Cheng | G02F 1/133512 |
| 2017/0146857 | A1* | 5/2017 | Wang | G02F 1/133621 |
| 2018/0164636 | A1* | 6/2018 | Gam | G02F 1/133528 |

FOREIGN PATENT DOCUMENTS

JP           2002365427 A       12/2002

* cited by examiner

*Primary Examiner* — Paul C Lee
(74) *Attorney, Agent, or Firm* — Tim Tingkang Xia, Esq.; Locke Lord LLP (57) ABSTRACT

A display cell structure includes a first liquid crystal display (LCD) panel and a second LCD panel. The first LCD panel includes a first polarizer layer, a second polarizer layer and a first liquid crystal layer, and liquid crystal molecules in the first liquid crystal layer have a first liquid crystal retardation. The second LCD panel includes a third polarizer layer, a fourth polarizer layer and a second liquid crystal layer, and liquid crystal molecules in the second liquid crystal layer have a second liquid crystal retardation. In some cases, the second liquid crystal retardation is different from the first liquid crystal retardation. In some cases, the third polarizer layer is a carbon nano-tube polarizer layer.

16 Claims, 9 Drawing Sheets

LIQUID CRYSTAL DISPLAY DEVICE COMPRISING FIRST AND SECOND LIQUID CRYSTAL DISPLAY PANELS RESPECTIVELY HAVING FIRST AND SECOND LIQUID CRYSTAL RETARDATIONS AND A COLOR CONVERSION LAYER

FIELD

The disclosure relates generally to display technology, and more particularly to an ultra high contrast liquid crystal display (LCD) device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Recently, high contrast ratio (CR) is a critical requirement for all display devices. However, a liquid crystal display (LCD) is a non-emissive display, and its CR is inherently limited. For example, the typical CR for the commercial LCD products is generally around 1000:1. To improve the relatively low CR of the LCD, the light emitting diode (LED) local dimming technology was introduced. To implement LED local dimming in a LCD panel, the LCD panel is provided with an array of individual LEDs behind the LCD panel, and each LED in the array is responsible for a certain area of the screen, allowing the CR to be greater than 100,000:1. However, due to low LED resolution, a user can easily see image blurring or image halo phenomena in the LCD panel implementing the LED local dimming technology, and currently it requires very complex algorithm to improve the blurring or halo issue. Further, a total module thickness of the LCD panel implementing the LED local dimming technology may be relatively thick.

Therefore, a heretofore unaddressed need exists in the art to address the aforementioned deficiencies and inadequacies.

SUMMARY

One aspect of the disclosure relates to a display cell structure, which includes: a first liquid crystal display (LCD) panel, comprising: a first substrate and a second substrate spaced apart from each other, forming a first gap between the first substrate and the second substrate; a color filter layer disposed between the first substrate and the second substrate; a first TFT layer disposed on the second substrate facing the first substrate; a first polarizer layer disposed on the first substrate; a second polarizer layer disposed on the second substrate; and a first liquid crystal layer disposed in the first gap between the first substrate and the second substrate, wherein liquid crystal molecules in the first liquid crystal layer have a first liquid crystal retardation; a second LCD panel, comprising: a third substrate and a fourth substrate spaced apart from each other, forming a second gap between the third substrate and the fourth substrate, wherein the third substrate is located between the second substrate of the first LCD panel and the fourth substrate, and the second substrate of the first LCD panel is located between the first substrate of the first LCD panel and the third substrate; a color conversion layer disposed on the third substrate facing the fourth substrate; a second TFT layer disposed on the fourth substrate facing the third substrate; a third polarizer layer disposed on the color conversion layer facing the fourth substrate; a fourth polarizer layer disposed on the fourth substrate; and a second liquid crystal layer disposed in the second gap between the third substrate and the fourth substrate, wherein liquid crystal molecules in the second liquid crystal layer have a second liquid crystal retardation, and the second liquid crystal retardation is different from the first liquid crystal retardation.

In certain embodiments, the display cell structure further includes a diffusion film disposed on the fourth polarizer, wherein the second LCD panel is located between the diffusion film and the first LCD panel.

In certain embodiments, the first liquid crystal retardation is in a range between 300 nm to 380 nm.

In certain embodiments, the second liquid crystal retardation is in a range between 240 nm to 280 nm.

In certain embodiments, the color conversion layer is formed with a wavelength converting material configured to absorb light at a first wavelength and emit light at a second wavelength different from the first wavelength.

In certain embodiments, the wavelength converting material is a phosphor material or a quantum dot material.

In certain embodiments, the third polarizer layer is a carbon nano-tube polarizer layer.

In certain embodiments, the carbon nano-tube polarizer layer comprises cylindrical carbon nano-tube molecules, and each of the cylindrical carbon nano-tube molecules aligns in an identical cylindrical direction.

In certain embodiments, the carbon nano-tube polarizer layer comprises auxiliary liquid crystal molecules, and a ratio of a weight percentage of the cylindrical carbon nano-tube molecules to the auxiliary liquid crystal molecules in the second liquid crystal layer is in a range of 5% to 10%.

Another aspect of the present disclosure relates to a display device, which includes a display cell structure as described above, and a blue light source configured to emit blue light toward the second LCD panel.

In certain embodiments, the blue light source includes: a plurality of blue light emitting diodes emitting the blue light; and a reflection sheet reflecting the blue light toward the second LCD panel.

In a further aspect of the present disclosure, a display device is provided, which includes: a first liquid crystal display (LCD) panel, comprising: a first substrate and a second substrate spaced apart from each other, forming a first gap between the first substrate and the second substrate; a color filter layer disposed between the first substrate and the second substrate; a first TFT layer disposed on the second substrate facing the first substrate; a first polarizer layer disposed on the first substrate; a second polarizer layer disposed on the second substrate; and a first liquid crystal layer disposed in the first gap between the first substrate and the second substrate, wherein liquid crystal molecules in the first liquid crystal layer have a first liquid crystal retardation; a second LCD panel, comprising: a third substrate and a fourth substrate spaced apart from each other, forming a second gap between the third substrate and the fourth substrate, wherein the third substrate is located between the second substrate of the first LCD panel and the fourth substrate, and the second substrate of the first LCD panel is located between the first substrate of the first LCD panel and the third substrate; a color conversion layer disposed on the third substrate facing the fourth substrate; a second TFT layer disposed on the fourth substrate facing the third substrate; a third polarizer layer disposed on the color conversion layer facing the fourth substrate, wherein the third polarizer layer is a carbon nano-tube polarizer layer; a fourth polarizer layer disposed on the fourth substrate and facing an opposite side to the third substrate; and a second liquid crystal layer disposed in the second gap between the third substrate and the fourth substrate, wherein liquid crystal molecules in the second liquid crystal layer have a second liquid crystal retardation.

In certain embodiments, the display device further includes a plurality of blue light emitting diodes emitting blue light toward the second display panel.

In certain embodiments, the second liquid crystal retardation is different from the first liquid crystal retardation.

In certain embodiments, the color conversion layer is formed with a wavelength converting material configured to absorb light at a first wavelength and emit light at a second wavelength different from the first wavelength.

In certain embodiments, the carbon nano-tube polarizer layer comprises cylindrical carbon nano-tube molecules, and each of the cylindrical carbon nano-tube molecules aligns in an identical cylindrical direction.

In yet another aspect of the present disclosure, a LCD cell includes: a first substrate and a second substrate spaced apart from each other, forming a cell gap between the first substrate and the second substrate; a color conversion layer disposed on the first substrate facing the second substrate, wherein the color conversion layer is formed with a wavelength converting material configured to absorb light at a first wavelength and emit light at a second wavelength different from the first wavelength; a TFT layer disposed on the second substrate facing the first substrate; a first polarizer layer disposed on the color conversion layer facing the second substrate, wherein the first polarizer layer is a carbon nano-tube polarizer layer; a second polarizer layer disposed on the second substrate and facing an opposite side to the first substrate; and a liquid crystal layer disposed in the cell gap between the first substrate and the second substrate, wherein liquid crystal molecules in the liquid crystal layer have a liquid crystal retardation.

In certain embodiments, the wavelength converting material is a phosphor material or a quantum dot material.

In certain embodiments, the liquid crystal retardation is in a range between 240 nm to 280 nm.

In certain embodiments, the carbon nano-tube polarizer layer comprises cylindrical carbon nano-tube molecules, and each of the cylindrical carbon nano-tube molecules aligns in an identical cylindrical direction.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION OF THE DISCLOSURE

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the "feeding end" of a receiver antenna refers to the "actual" feeding end being electrically connected to a corresponding signal line. Generally, a receiver antenna has an outer feeding end and an inner feeding end, where one of the outer feeding end and the inner feeding end serves as the "feeding end" and the other of the outer feeding end and the inner feeding end serves as a reference end, which may be grounded or electrically connected to a reference voltage level (such as the common voltage $V_{COM}$ provided by a common electrode).

The description will be made as to the embodiments of the present disclosure in conjunction with the accompanying drawings. In accordance with the purposes of this disclosure, as embodied and broadly described herein, this disclosure, in certain aspects, relates to a wireless display panel with multi-channel data transmission and a display device using the same.

As discussed above, it requires very complex algorithm to improve the blurring or halo issue in the LCD panel implementing the LED local dimming technology. Recently, the pixel level local dimming technology was proposed. In a LCD panel implementing the pixel level local dimming technology, a light modulating panel (also known as a shutter panel or a switch panel) is provided behind the display panel, and the light modulating panel and the display panel have the same resolution. Compared to the LCD panel implementing the LED local dimming technology, the LCD panel implementing the pixel level local dimming technology shows low image blur and image halo, and may have a slimmer thickness. Thus, the pixel level local dimming technology may be used to improve the blurring issue.

Figure 1A:
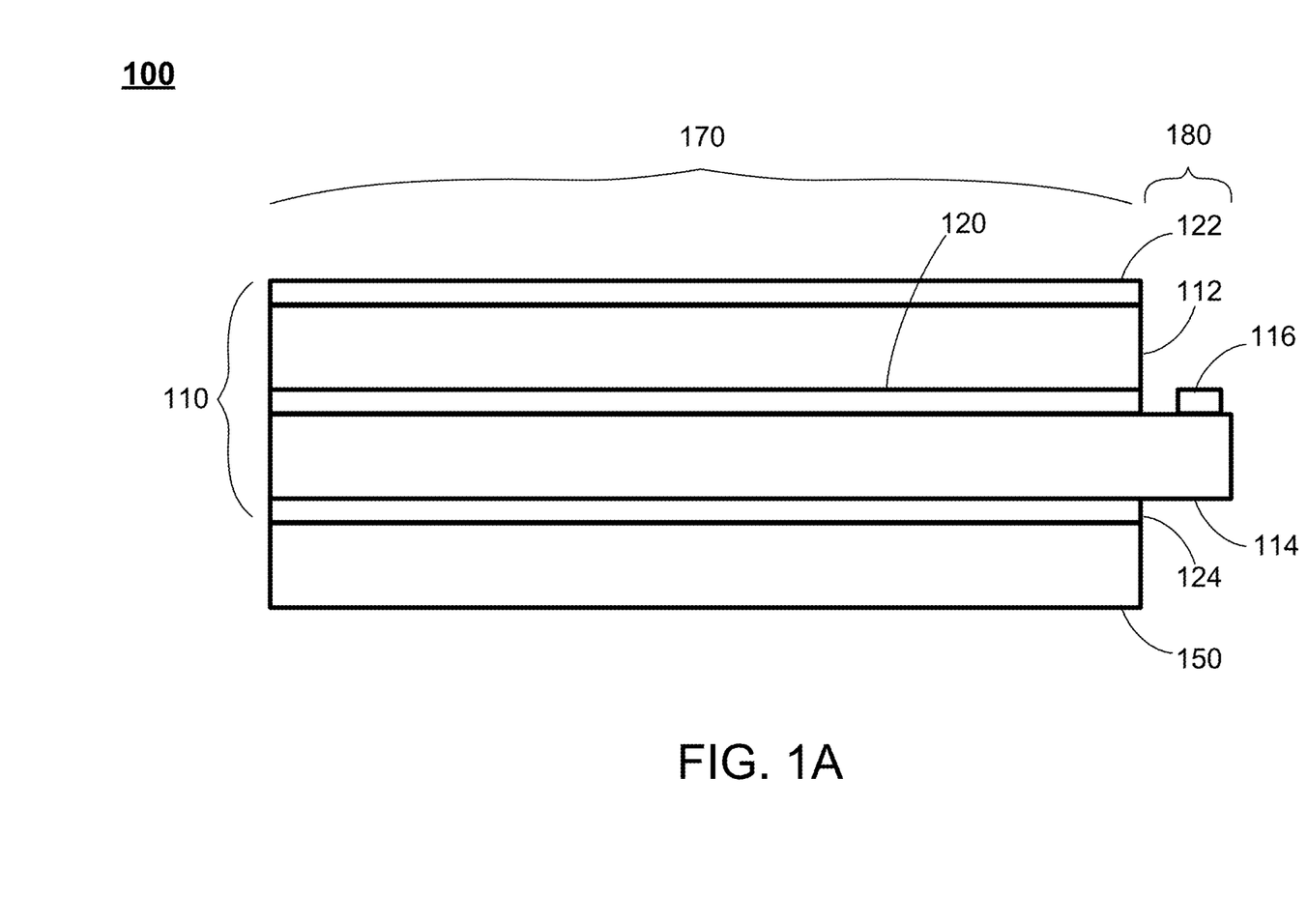
FIG. 1A schematically shows a one-panel display device according to certain embodiments of the present disclosure.

However, the LCD panel implementing the pixel level local dimming technology has a two-panel structure, which has some deficiencies in comparison to the normal one-panel structure. For example, FIG. 1A schematically shows a one-panel display device according to certain embodiments of the present disclosure. As shown in FIG. 1A, the one-panel display device 100 includes a LCD panel 110 and a light source 150. The light source 150 is disposed at a lower side of the LCD panel 110 to emit light toward the LCD panel 110. In other words, in the display device 100 as shown in FIG. 1A, the upper side is a display side, and the lower side is a backlight side. The LCD panel 110 is a normal LCD panel, which includes a first substrate 112, a second substrate 114, a liquid crystal layer 120, a first polarizer 122 and a second polarizer 124. The first substrate 112 is located at the upper side (i.e., the display side) relative to the second substrate 114. Further, the first substrate 112 and the second substrate 114 are spaced apart from each other, forming a cell gap between the first substrate 112 and the second substrate 114, such that the liquid crystal layer 120 is disposed in the cell gap. The first polarizer layer 122 is disposed on the upper side of the first substrate 112, and the second polarizer layer 124 is disposed on the lower side of the second substrate 114. In this case, the second polarizer layer 124 directly faces the light source 150. In certain embodiments, the LCD panel 110 may have other structures or layers not shown in FIG. 1A, such as a color filter layer, a TFT layer, and sealing structures to seal the liquid crystal layer 120. Moreover, as shown in FIG. 1A, the second substrate 114 has an extended area in comparison to other layers, such that a display area 170 corresponding to the liquid crystal layer 120 and a peripheral area 180 are defined. Thus, one or more driver integrated circuits (ICs) may be provided in the peripheral area 180 on the second substrate 114 to control the driving of the pixels of the LCD panel 110.

Figure 1B:
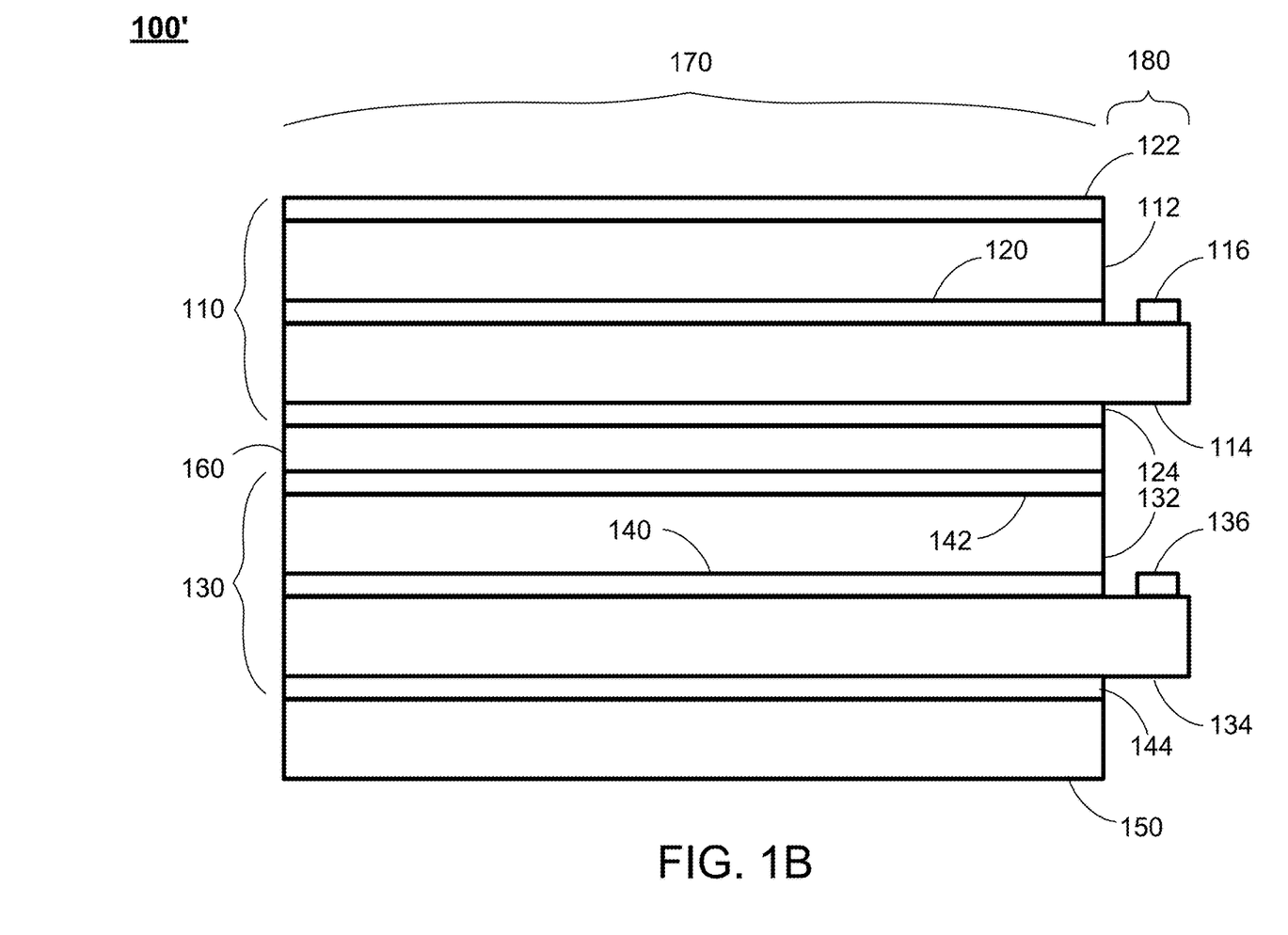
FIG. 1B schematically shows a two-panel high CR display device according to certain embodiments of the present disclosure.

In comparison, FIG. 1B schematically shows a two-panel high CR display device according to certain embodiments of the present disclosure. As shown in FIG. 1B, the two-panel display device 100' is a two-panel structure which may implement the pixel level local dimming technology. Specifically, the difference between the two-panel display device 100' as shown in FIG. 1B and the one-panel display device 100 as shown in FIG. 1A exists in that, in addition to the LCD panel 110 and the light source 150, the two-panel display device 100' further includes an additional LCD panel 130 between the LC panel 110 and the light source 150, and a diffusion film 160 between the two LCD panels 110 and 130. For clarification purposes, in the two-panel display device 100', the LCD panel 110 is referred to as the first LCD panel 110, and the additional LCD panel 130 is referred to as the second LC panel 130. In this case, the first LCD panel 110 is located at the upper side (i.e., the display side) and functions as a display panel, which has essentially identical structures to the LCD panel 110 as shown in FIG. 1A, and is not elaborated herein. The second LCD panel 130 is located at the lower side (i.e., the backlight side) and functions as a shutter/switch panel, and also has a similar structure to the first LCD panel 110, including a third substrate 132, a fourth substrate 134, a liquid crystal layer 140, a third polarizer 142 and a fourth polarizer 144. The third substrate 132 is located at the upper side (i.e., the display side) relative to the fourth substrate 134. Further, the third substrate 132 and the fourth substrate 134 are spaced apart from each other, forming a cell gap between the third substrate 132 and the fourth substrate 134, such that the liquid crystal layer 140 is disposed in the cell gap. The third polarizer layer 142 is disposed on the upper side of the third substrate 132, and the fourth polarizer layer 144 is disposed on the lower side of the fourth substrate 134. In this case, the third polarizer layer 142 directly faces the diffusion film 160, and the fourth polarizer layer 144 directly faces the light source 150. In certain embodiments, the second LCD panel 130 may have other structures or layers not shown in FIG. 1B, such as a TFT layer and sealing structures to seal the liquid crystal layer 120. Moreover, as shown in FIG. 1B, the fourth substrate 134 also has an extended area in comparison to other layers that corresponds to the peripheral area 180, enabling one or more driver ICs 136 for the second LCD panel 130 to be provided in the peripheral area 180 on the fourth substrate 134 to control the driving of the pixels of the second LCD panel 130.

As shown in FIGS. 1A and 1B, the two-panel display device 100', which may be used to implement the pixel level local dimming technology, has the additional second LCD panel 130. Due to this additional LCD panel, the two-panel display device 100' may have a relatively low transmittance of display in comparison to the one-panel display device 100. For example, if the transmittance of the one-panel display device 100 is defined as 100%, the transmittance of the two-panel display device 100' is about 30%. Further, the additional second LCD panel 130 in the two-panel display device 100' requires its own set of driver ICs 136, thereby doubling the overall quantity and cost the driver ICs used in the two-panel display device 100'.

In view of the foregoing deficiencies, one aspect of the disclosure is related to a display cell structure, which adopts the two-panel structure while aiming on improving the transmittance and reducing the overall driver IC quantity and cost.

Figure 2:
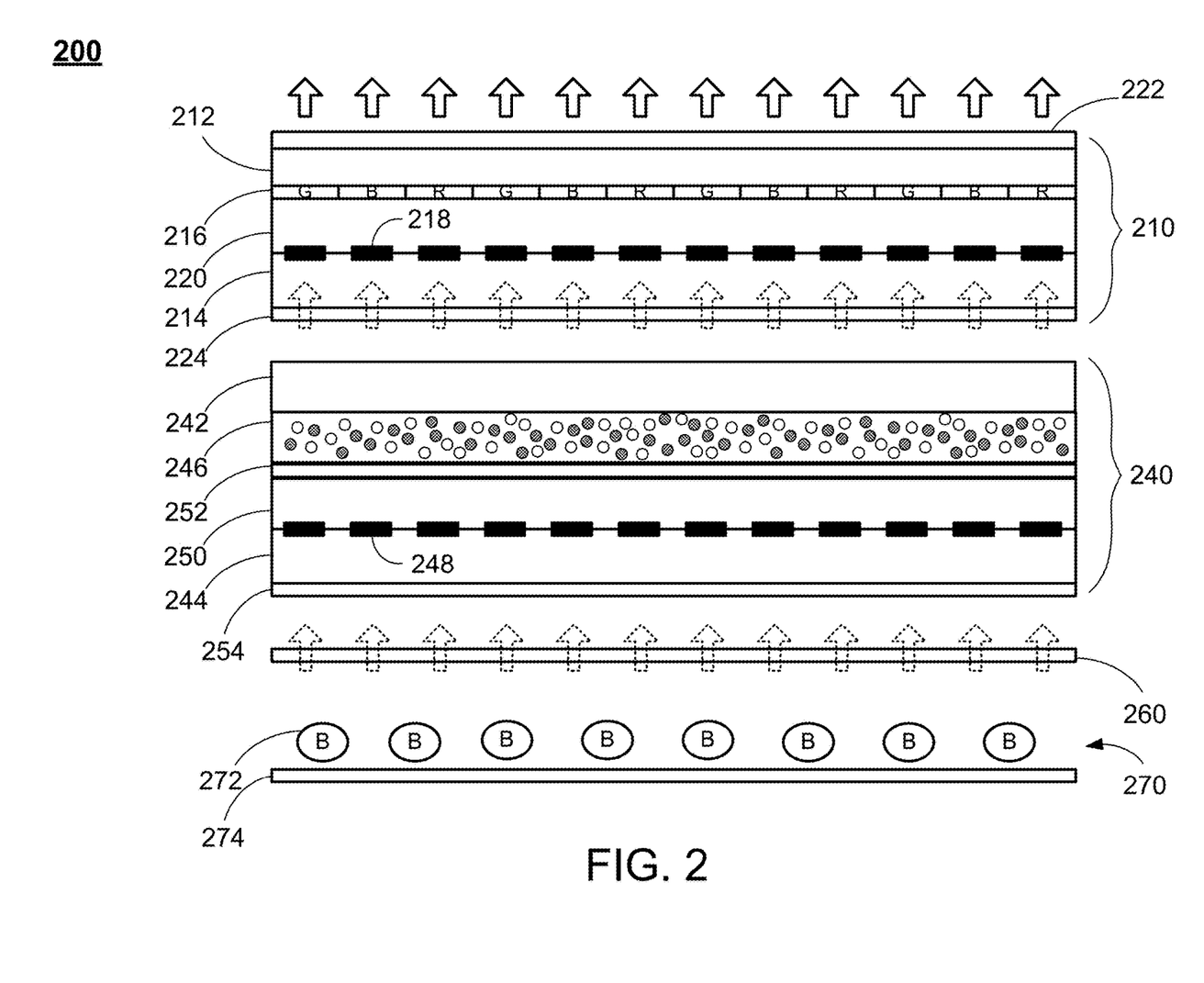
FIG. 2 schematically shows a display device according to certain embodiments of the present disclosure.

FIG. 2 schematically shows a display device according to certain embodiments of the present disclosure. As shown in FIG. 2, the display device 200 is also a two-panel display device, which includes a first LCD panel 210, a second LCD panel 240, a diffusion film 260 and a blue light source 270. The first LCD panel 210 and the second LCD panel 240 collectively form a display cell structure. The blue light source 270 is disposed at a lower side of the display cell structure to emit blue light toward the display cell structure, and the diffusion film 260 is disposed between the blue light source 270 and the display cell structure. In other words, in the display device 200 as shown in FIG. 2, the upper side is a display side, and the lower side is a backlight side. The first LCD panel 210 is located at the upper side (i.e., the display side) of the display cell structure and functions as a display panel, and the second LCD panel 240 is located at the lower side (i.e., the backlight side) of the display cell structure and functions as a shutter/switch panel. In other words, the second LCD panel 240 is located between the diffusion film 260 and the first LCD panel 210, and the diffusion film 260 is disposed between the blue light source 270 and the second LCD panel 240. It should be particularly noted that, in the display device 200, there is no diffusion film between the first LCD panel 210 and the second LCD panel 240.

As shown in FIG. 2, the first LCD panel 210 includes a first substrate 212, a second substrate 214, a color filter layer 216, a first TFT layer 218, a first liquid crystal layer 220, a first polarizer layer 222 and a second polarizer layer 224. The first substrate 212 is located at the upper side (i.e., the display side) relative to the second substrate 214. Further, the first substrate 212 and the second substrate 214 are spaced apart from each other, forming a first gap between the first substrate 212 and the second substrate 214, such that the color filter layer 216, the first TFT layer 218 and the first liquid crystal layer 220 are all disposed in the first gap between the first substrate 212 and the second substrate 214. The color filter layer 216 is disposed on the bottom side of the first substrate 212, and the first polarizer layer 222 is disposed on the upper side of the first substrate 212. The first TFT layer 218 is disposed on the upper side of the second substrate 214, and the second polarizer layer 224 is disposed on the lower side of the second substrate 214. The first liquid crystal layer 220 is disposed in the first gap between the first substrate 212 and the second substrate 214, such that the color filter layer 216 and the first TFT layer 218 respectively face the first liquid crystal layer 220. The liquid crystal molecules in the first liquid crystal layer 220 have a first liquid crystal retardation $\Delta nd_1$, where $\Delta n$ refers to the birefringence of the liquid crystal molecules of the first liquid crystal layer 220, and $d_1$ refers to the thickness of the first liquid crystal layer 220. In certain embodiments, the first LCD panel 210 may have other structures or layers not shown in FIG. 2, such as sealing structures to seal the first liquid crystal layer 220.

The second LCD panel 240 includes a third substrate 242, a fourth substrate 244, a color conversion layer 246, a second TFT layer 248, a second liquid crystal layer 250, a third polarizer layer 252, and a fourth polarizer layer 254. The third substrate 242 is located at the upper side (i.e., the display side) relative to the fourth substrate 244. Further, the third substrate 242 and the fourth substrate 244 are spaced apart from each other, forming a second gap between the third substrate 242 and the fourth substrate 244, such that the color conversion layer 246, the second TFT layer 248, the third polarizer layer 252 and the second liquid crystal layer 250 are all disposed in the second gap between the third substrate 242 and the fourth substrate 244. The color conversion layer 246 is disposed on the bottom side of the third substrate 242, and the third polarizer layer 252 is disposed on the bottom side of the color conversion layer 246. It should be noted that there is no polarizer layer disposed on the upper side of the third substrate 242. The second TFT layer 248 is disposed on the upper side of the fourth substrate 244, and the fourth polarizer layer 254 is disposed on the lower side of the second substrate 214. The second liquid crystal layer 250 is disposed in the second gap between the third substrate 242 and the fourth substrate 244, such that the third polarizer layer 252 and the second TFT layer 248 respectively face the second liquid crystal layer 250. The liquid crystal molecules in the second liquid crystal layer 250 have a second liquid crystal retardation $\Delta nd_2$, where $\Delta n$ refers to the birefringence of the liquid crystal molecules of the second liquid crystal layer 250, and $d_2$ refers to the thickness of the second liquid crystal layer 250. In certain embodiments, the second LCD panel 240 may have other structures or layers not shown in FIG. 2, such as sealing structures to seal the second liquid crystal layer 250.

One of the differences between the display device 200 as shown in
FIG. 2 from the two-panel display device 100' as shown in FIG. 1B exists in the use of the blue light source 270 as the light source of the display device 200. As discussed above, the blue light source 270 is used to emit blue light. As shown in FIG. 2, the blue light source 270 includes a plurality of blue light emitting diodes 272 emitting the blue light, and a reflection sheet 274 used to reflect the blue light upward, such that the blue light may pass the diffusion film 260 and enter the second LCD panel 240. In certain embodiments, the blue light emitting diodes 272 may be disposed in an array, such that each blue light emitting diode 272 is responsible for a certain area of the display device 200.

Another difference between the display device 200 as shown in FIG. 2 from the two-panel display device 100' as shown in FIG. 1B exists in the use of the color conversion layer 246 in the second LCD panel 240 to match with the blue light source 270. In certain embodiments, the color conversion layer 246 is formed with one or more wavelength converting materials, which may be used to absorb light at a first wavelength and emit light at a second wavelength different from the first wavelength. In this case, since the color conversion layer 246 is provided to match with the blue light source 270, the wavelength converting materials are used to absorb a portion of the blue light emitted by the blue light source 270 and emit light in other colors, such as the red light and green light. Thus, the blue light not being absorbed by the wavelength converting materials may be mixed with the red light and green light emitted by the wavelength converting materials to become white light.

Figure 3A:
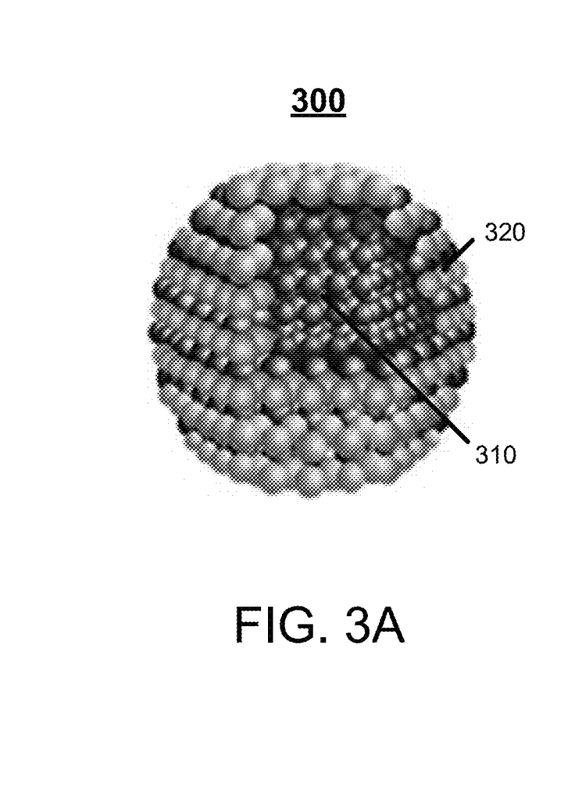
FIG. 3A schematically shows a quantum dot structure according to certain embodiments of the present disclosure.

In certain embodiments, the wavelength converting materials may include phosphor materials. Specifically, one type of the phosphor materials is a quantum dot material, in which each phosphor particle is a quantum dot. Quantum dot technology has been used in the color LCD devices to improve the color gamut. A quantum dot is a nanocrystal core/shell structure made of semiconductor materials that are small enough (less than tens of nanometers) to exhibit quantum mechanical properties, where the electrical and optical characteristics differ from the bulk properties due to quantum confinement effects. For example, the size of a quantum dot may be about 1-10 nm in diameter. FIG. 3A schematically shows a quantum dot structure according to certain embodiments of the present disclosure. As shown in FIG. 3A, the quantum dot 300 has a plurality of core nanocrystals 310 and a plurality of shell nanocrystals 320. Specifically, the excitons of the quantum dots are confined in all three spatial dimensions. The electronic properties of the quantum dot materials are intermediate between those of bulk semiconductors and of discrete molecules. In certain embodiments, the quantum dots can be synthesized with larger (thicker) shells, which may be directly correlated to the spectroscopic properties of the particles like lifetime, emission intensity, and long-term stability.

Figure 3B:
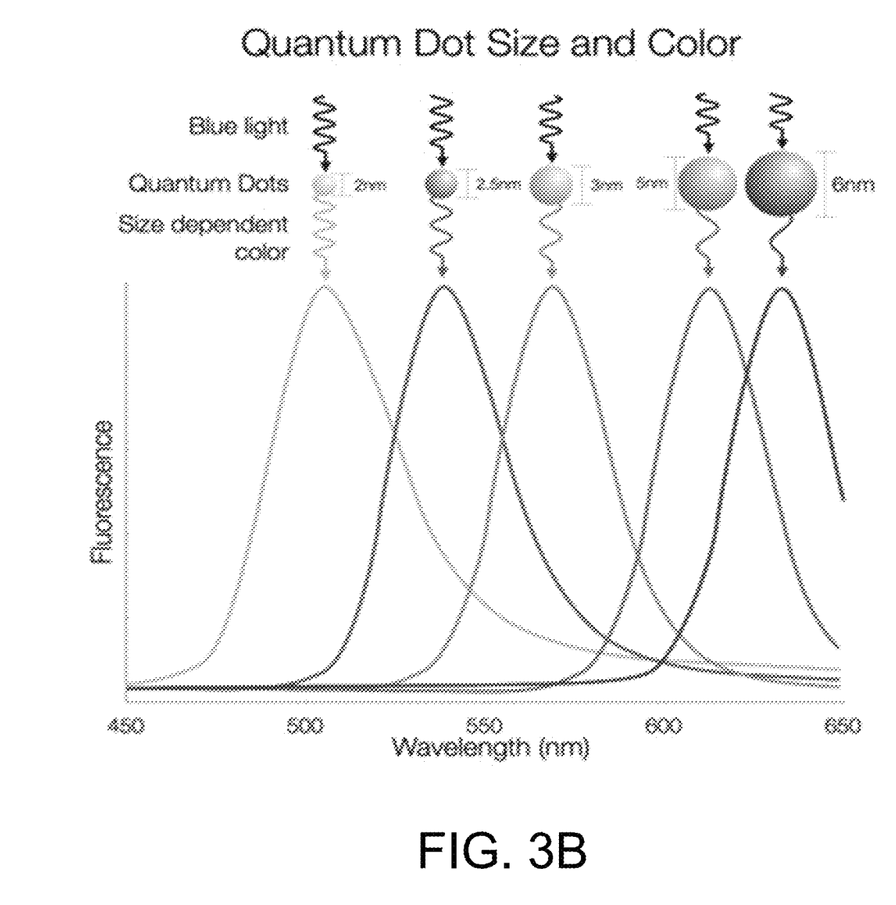
FIG. 3B schematically shows the size-dependent emission feature of excited quantum dots according to certain embodiments of the present disclosure.

One of the optical properties of the quantum dots relates to the size-dependent emission feature. Specifically, the emission properties of quantum dots are related to their size and shape in addition to their composition. This allows size-dependent tuning of the semiconductor photoluminescence emission wavelength throughout the visible spectrum, with a sharp emission spectrum and high quantum efficiency. When a quantum dot is excited by a light at a certain wavelength, the light emitted by the excited quantum dot is determined by the crystal size of the quantum dot. More specifically, when the size of the quantum dot becomes larger, the fluorescence spectrum of the emission moves toward the red light (longer wavelength). FIG. 3B schematically shows the size-dependent emission feature of excited quantum dots according to certain embodiments of the present disclosure. As shown in FIG. 3B, five quantum dots (A, B, C, D, E from left to right) having different sizes of nanocrystals are simultaneously excited by an incident light having the wavelength of 365 nm (which is in the range of violet light), and the emissions of the five quantum dots (A, B, C, D, E) are shown to have different wavelengths, ranging from about 450 nm to about 650 nm, which substantially cover the wavelength range of the visible spectrum. In other words, the emission of the quantum dots may include the three primary colors of R (620-750 nm of wavelength), G (495-570 nm), and B (450-495 nm). In certain embodiments, the full width at half maximum (FWHM) of the quantum dots may be about 30-40 nm. Generally, the quantum dots have high quantum yields of about 90%.

Figure 4:
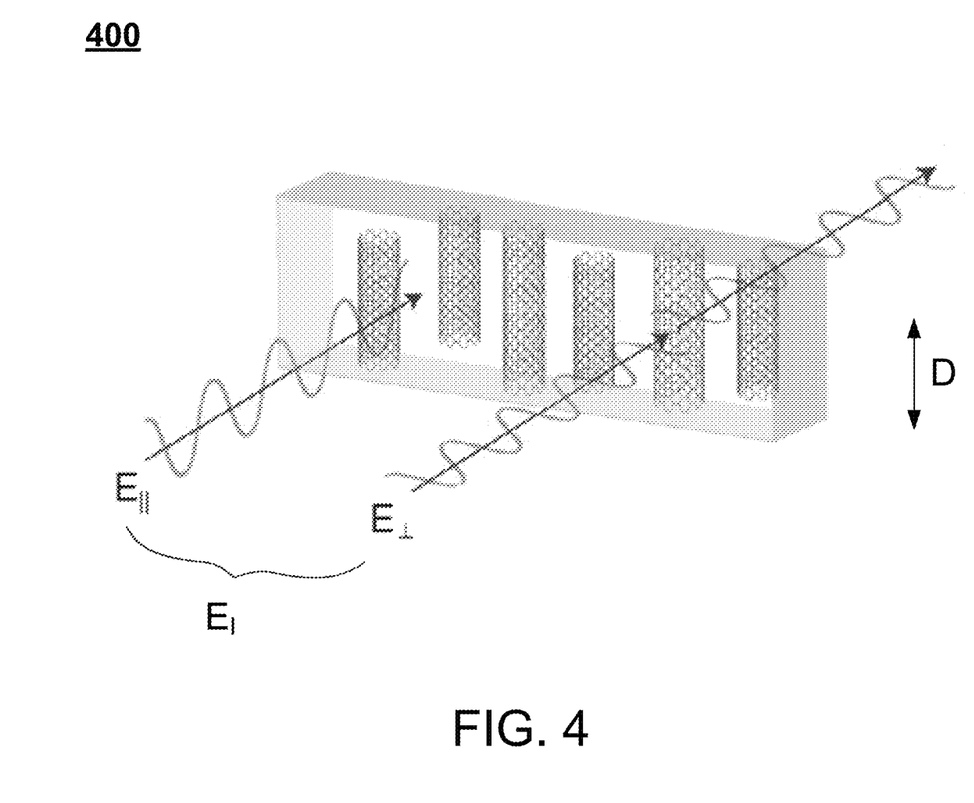
FIG. 4 schematically shows an exemplary carbon nano-tube polarizer layer according to certain embodiments of the present disclosure.

As discussed above, quantum dot technology may be used in the color LCD devices to improve the color gamut. However, using the quantum dot technology alone may not improve light efficiency of the LCD devices. Thus, another difference between the display device 200 as shown in FIG. 2 from the two-panel display device 100' as shown in FIG. 1B exists in the third polarizer layer 252 of the second LCD panel. Specifically, in the display device 200, the third polarizer layer 252 is an in-cell polarizer layer. In certain embodiments, the third polarizer layer 252 may be a carbon nano-tube (CNT) polarizer layer, which is formed by CNT molecules. CNTs are cylindrical molecules with diameters as small as 1 nm and lengths up to several micrometers, which include carbon atoms and can be thought of as graphene sheets wrapped into cylinders. It has been confirmed that aligned CNTs may function as a polarizer. That is, a carbon nano-tube absorbs light whose linear polarization is parallel to the axis of the carbon nano-tube, but not when the polarization is perpendicular to the axis. For example, FIG. 4 schematically shows an exemplary carbon nano-tube polarizer layer according to certain embodiments of the present disclosure. As shown in FIG. 4, the carbon nano-tube polarizer layer 400 is formed with cylindrical carbon nano-tube molecules, and each of the cylindrical carbon nano-tube molecules aligns in an identical cylindrical direction D, which is the vertical direction as shown in FIG. 4. Thus, if light $E_I$ entering the carbon nano-tube polarizer layer 400 has the linear polarization perpendicular to the axis of the carbon nano-tubes, the light $E\perp$ is not absorbed by the carbon nano-tube polarizer layer 400 and will thus pass through the carbon nano-tube polarizer layer 400. In contrast, if light $E_I$ entering the carbon nano-tube polarizer layer 400 has the linear polarization parallel to the axis of the carbon nano-tubes, the light $E_{//}$ is absorbed by the carbon nano-tube polarizer layer 400 and thus does not pass therethrough.

In certain embodiments, the carbon nano-tube polarizer layer 400 may be formed by a substrate, on which an alignment layer and a polarization layer are formed. For example, the substrate of the carbon nano-tube polarizer layer 400 may be a transparent film or a transparent material such as glass or plastic, and the alignment layer is formed of polyimide or polyamide is applied on the substrate. Specifically, after polyimide or polyamide is applied, heat is applied to cure the polyimide or polyamide to thus form the alignment layer. Then, numerous micro-grooves are formed in a predetermined direction in the entirety of the alignment layer rubbed in their direction. The polarization layers are formed of a host material and a guest material. As the host material, liquid crystalline polymer or reactive mesogens exhibiting liquid crystalline properties is used. The reactive mesogens, a liquid crystal material including an end group available to be polarized, is monomer molecules having a liquid crystal phase by including an end group that can be polarized with mesogens manifesting liquid crystalline properties. The guest material is formed of carbon nanotube materials. The carbon nanotube absorbs one of two polarization components and allows the other to be transmitted there through. In certain embodiments, an single-wall carbon nanotube (SWCNT), an multi-wall carbon nanotube (MWCNT) and the like may be used as the carbon nanotube.

The carbon nanotube absorbs light having a particular wavelength region or allows such to be transmitted there through, the carbon nanotube absorbs light having a wavelength band corresponding to R, G, and B colors and allows such to be transmitted there through, thereby polarizing visible light. When the polarization layer in which carbon nanotubes are mixed with a liquid crystalline polymer or reactive mesogens and carbon nanotubes as guests are mixed is applied to the alignment layer rubbed in their direction, the micro-grooves formed on the alignment layer and the host material interact and the reactive mesogens (or liquid crystalline polymer) are aligned in their direction, and the carbon nanotubes are also aligned along the reactive mesogens, and as the polymerization is in progress, the alignment direction is maintained.

When light is irradiated to the polarization layer on which the reactive mesogens and the carbon nanotubes are aligned, a polarization component of their direction parallel to the carbon nanotubes are absorbed by the carbon nanotubes, and thus, Y direction becomes a light absorption axis, and a polarization component of the X direction perpendicular to the alignment of the carbon nanotubes are transmitted as is, rather than being absorbed, and thus, the X direction becomes a light transmission axis. When the hosts and the guests are mixed in an appropriate ratio to precisely align the guests, since various types of guests are not sufficiently mixed, a polarization degree is not uniformly maintained in the entire region of visible light, reducing a polarization degree. In certain embodiments, the CNTs are in an amount of 1 to 10 wt % of the carbon nano-tube polarizer layer. In one embodiment, the CNTs are in an amount of 3 to 7 wt % thereof.

Figure 5:
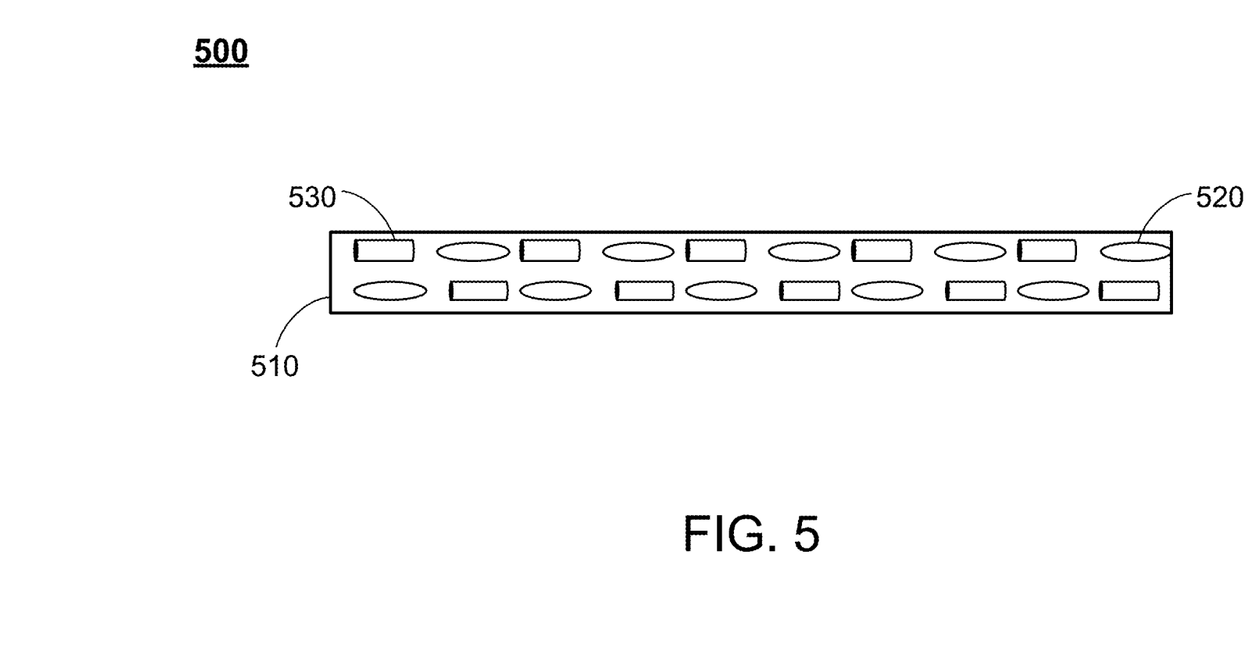
FIG. 5 schematically shows a carbon nano-tube polarizer layer formed by mixing CNT molecules with auxiliary liquid crystal molecules according to certain embodiments of the present disclosure.

In certain embodiments, the carbon nano-tube polarizer layer can be formed by mixing CNT molecules with liquid crystal molecules. To differentiate the liquid crystal molecules being added in the carbon nano-tube polarizer layer from the liquid crystal molecules in either the second liquid crystal layer 220 or the second liquid crystal layer 250, the liquid crystal molecules being added in the carbon nano-tube polarizer layer are hereinafter referred to as the "auxiliary liquid crystal molecules." FIG. 5 schematically shows a carbon nano-tube polarizer layer formed by mixing CNT molecules with auxiliary liquid crystal molecules according to certain embodiments of the present disclosure. As shown in FIG. 5, the carbon nano-tube polarizer layer 500 is formed with a bulk material 510 as the base, and multiple auxiliary liquid crystal molecules 520 and CNT molecules 530 are mixed in the bulk material 510 to form as an integral layer. In this case, the molecules in the carbon nano-tube polarizer layer 500 include a mix of the cylindrical carbon nano-tube molecules 530 and and the auxiliary liquid crystal molecules 520, and a ratio of a weight percentage of the cylindrical carbon nano-tube molecules 530 to the auxiliary liquid crystal molecules 520 is in a range of 5% to 10%.

With the use of the color conversion layer 246 in the second LCD panel 240 to generate white light by converting a portion of blue light to red light and green light and mixing the blue light, red light and green light to become the white light, there is only the blue light passing the second liquid crystal layer 250 of the second LCD panel 240. Thus, the second LCD panel 240 may be designed to provide higher transmittance for the blue light, thus improving the overall transmittance of the display device 200.

For a color LCD panel, factors related to transmittance may include the cell gap size and the liquid crystal retardation of the liquid crystal layer. Thus, still another difference between the display device 200 as shown in FIG. 2 from the two-panel display device 100' as shown in FIG. 1B exists in the different liquid crystal retardations of the liquid crystal layers in the two LCD panels. As discussed above, the liquid crystal molecules in the first liquid crystal layer 220 have a first liquid crystal retardation $\Delta nd_1$, and the liquid crystal molecules in the second liquid crystal layer 250 have a second liquid crystal retardation $\Delta nd_2$. Since the first LCD panel 210 functions as a display panel and the second LCD panel 240 functions as a shutter/switch panel, in certain embodiments, the second liquid crystal retardation of the second liquid crystal layer 250 in the second LCD panel 240 may be different from the first liquid crystal retardation of the first liquid crystal layer 220 in the first LCD panel 210.

Figure 6A:
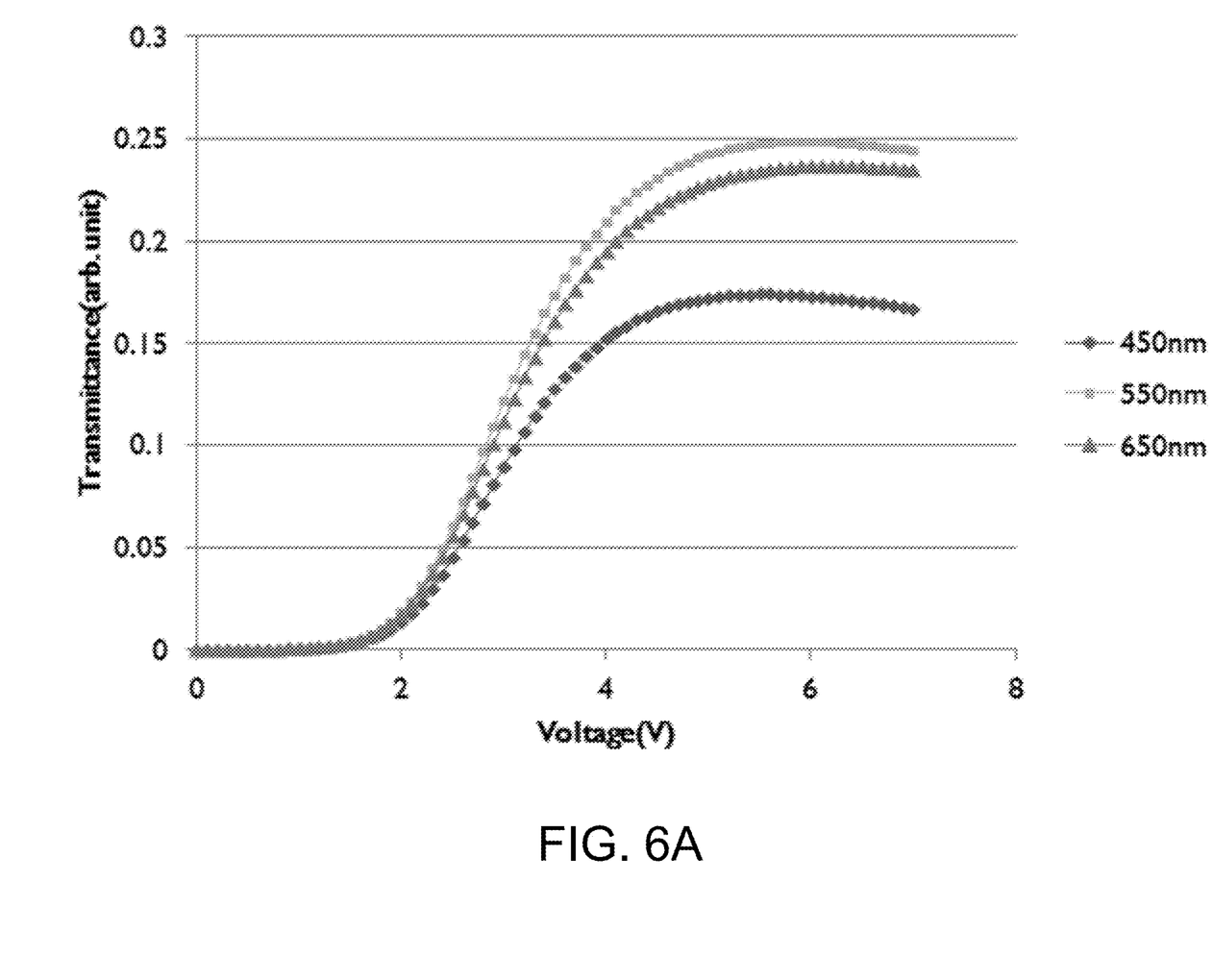
FIG. 6A shows the color transmittance feature of the first LCD panel of the display device as shown in FIG. 2 according to certain embodiments of the present disclosure.
Figure 6B:
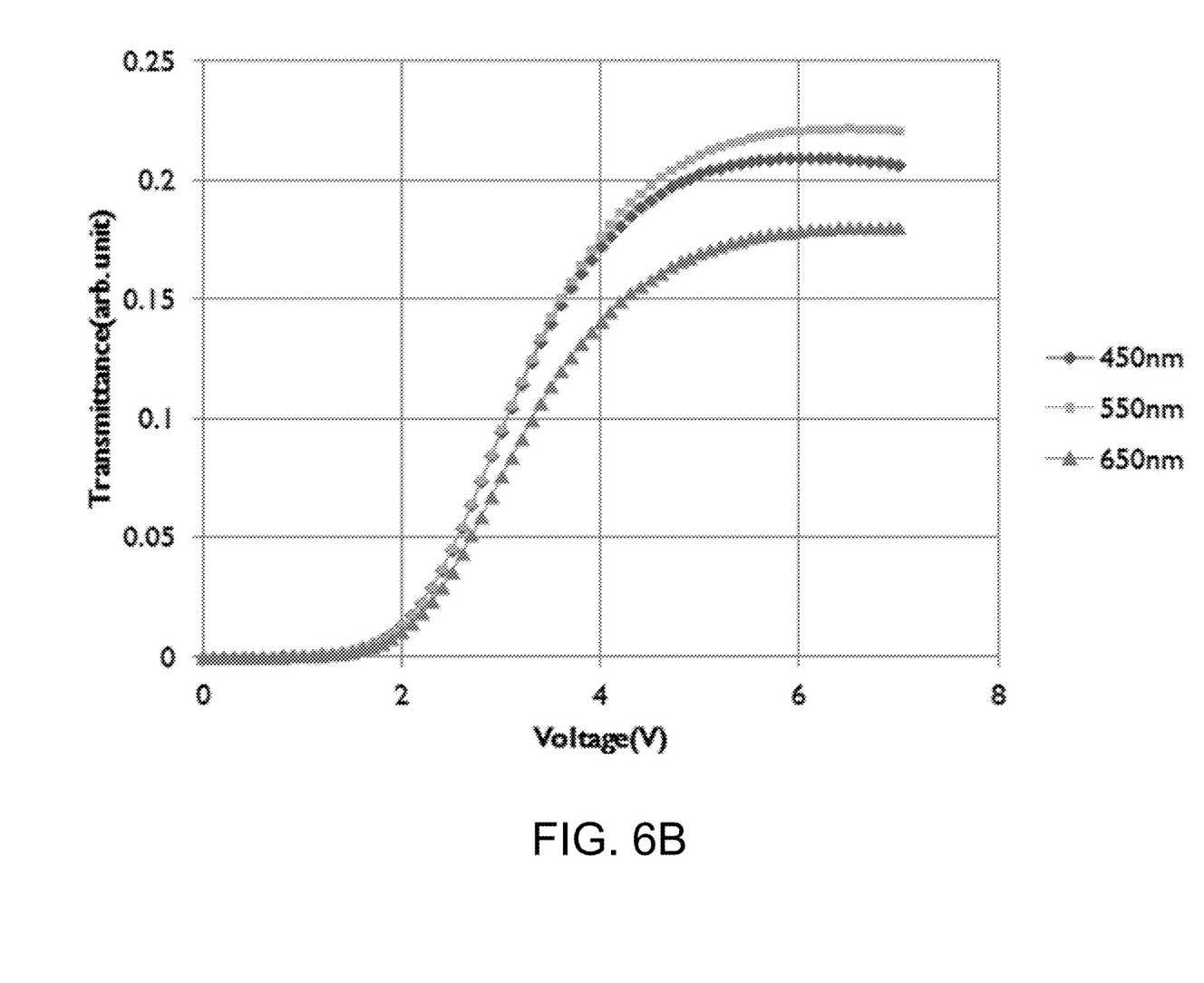
FIG. 6B shows the color transmittance feature of the second LCD panel of the display device as shown in FIG. 2 according to certain embodiments of the present disclosure.
Figure 7:
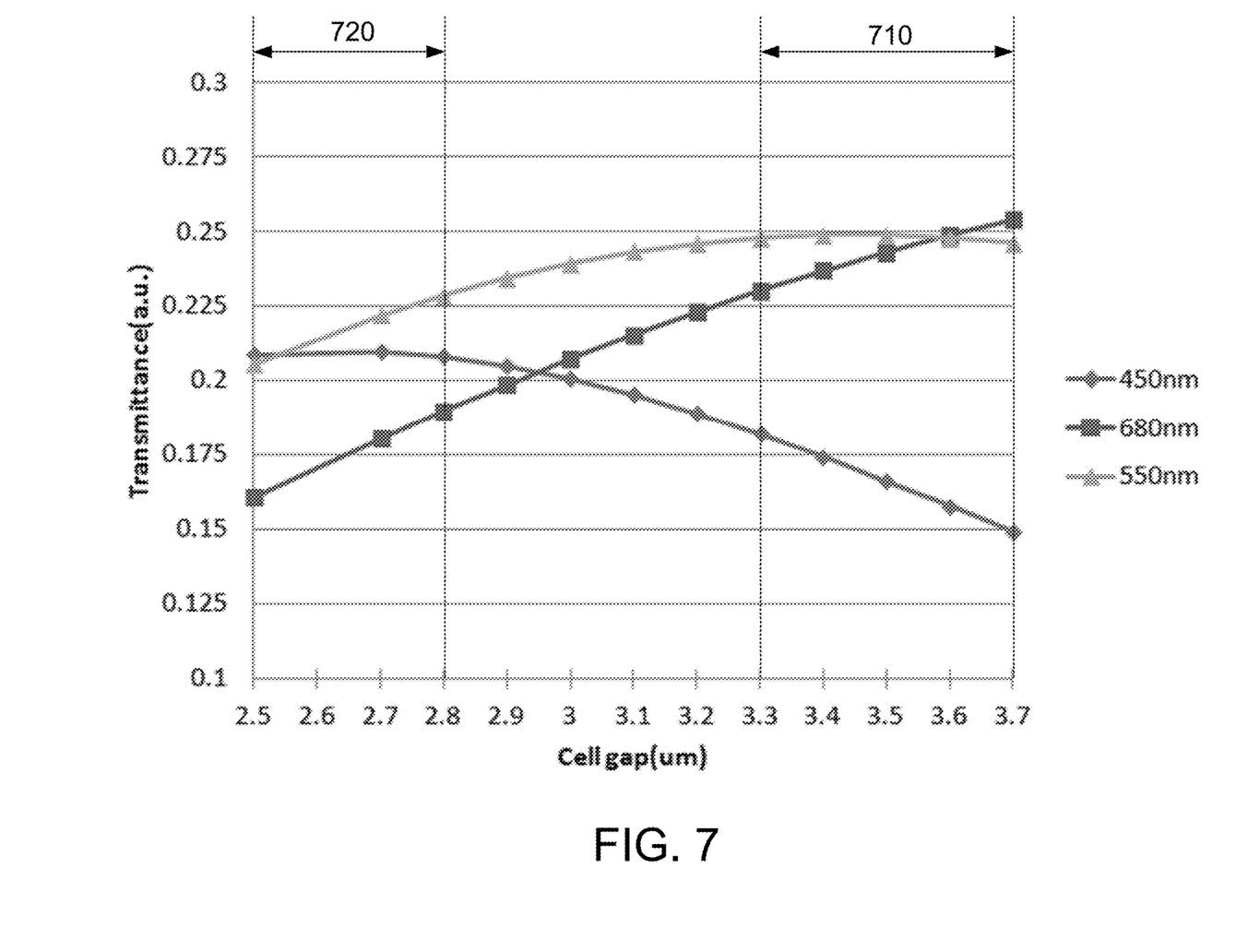
FIG. 7 shows the color transmittance features of a LCD panel related to the cell gap size according to certain embodiments of the present disclosure.

FIGS. 6A and 6B show the color transmittance features of the first LCD panel 210 and the second LCD panel 240 of the display device 200 as shown in FIG. 2 according to certain embodiments of the present disclosure, and FIG. 7 shows the color transmittance features of a LCD panel related to the cell gap size according to certain embodiments of the present disclosure. As shown in FIG. 7, the blue light (450 nm) has a relatively higher transmittance when the cell gap size is smaller. Thus, the size of the first gap for the first LCD panel 210 may be determined at a range 710 between 3.3 μm and 3.7 μm, while the size of the second gap for the second LCD panel 240 may be determined at a range 720 between 2.5 μm and 2.8 μm, allowing the second LCD panel 240 to have the higher transmittance for the blue light.

As shown in FIG. 6A, the transmittance features corresponding to the voltage input for the first LCD panel 210 is obtained when the first gap is set as 3.66 μm. In this case, the green light (550 nm) has the highest transmittance, while the red light (650 nm) and the blue light (450 nm) have relatively lower transmittance. In certain embodiments, the first liquid crystal retardation $\Delta nd_1$ of the first liquid crystal layer 220 of the first LCD panel 210 may be in a range between 300 nm to 380 nm.

As shown in FIG. 6B, the transmittance features corresponding to the voltage input for the second LCD panel 240 is obtained when the second gap is set as 2.75 μm. In this case, the blue light (450 nm) has the highest transmittance, while the red light (650 nm) and the green light (550 nm) have relatively lower transmittance. For example, the blue light may have the transmittance of about 96.8%, while the red light has the transmittance of about 63.5% at 8V. In certain embodiments, the second liquid crystal retardation $\Delta nd_2$ of the second liquid crystal layer 250 of the second LCD panel 240 may be in a range between 240 nm to 280 nm, which is different from the first liquid crystal retardation $\Delta nd_1$.

The relationship between the light wavelength and the cell gap for maximum transmittance is provided in Table A as below:

| Wavelength | LC birefringence Δn | Cell gap for maximum transmittance |
|---|---|---|
| 450 nm | 0.1064 | 3.20 μm |
| 550 nm | 0.0983 | 3.46 μm |
| 650 nm | 0.0969 | 3.51 μm |

As discussed above, the display device 200 may improve the overall transmittance. Further, since the display device 200 utilizes the blue light source 270 and the second LCD panel 240 is provided with the color conversion layer 246, the overall quantity and cost of the driver ICs may be further reduced.

It should be particularly noted that the display device 200 as shown in FIG. 2 is merely provided as an embodiment of the present disclosure. In certain embodiments, the second LCD panel 240 as shown in FIG. 2 may be matched with a LCD panel with a different structure from the first LCD panel 210 as shown in FIG. 2 to form the two-panel display device. For example, a LCD panel having the color filters on array (COA) may be utilized as the first LCD panel 210, in which the color filter layer may be disposed on the second substrate 214 instead of the first substrate 212. Further, in certain embodiments, the location of the first polarizer layer 222 and the second polarizer layer 224 in the first LCD panel 210 may be changed such that one or both of the first polarizer layer 222 and the second polarizer layer 224 may be in-cell polarizer(s).

The embodiments of the display device structures and components thereof as described above may be used in different types of display panels and/or display apparatuses. Further, the embodiments as described above are provided for the purposes of illustration and description. Although certain features may be described in different embodiments respectively, these features may be combined altogether to form other embodiments without departing from the spirit and scope of the disclosure.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display cell structure, comprising:
a first liquid crystal display (LCD) panel, comprising:
a first substrate and a second substrate spaced apart from each other, forming a first gap between the first substrate and the second substrate;
a color filter layer disposed between the first substrate and the second substrate;
a first TFT layer disposed on the second substrate facing the first substrate;
a first polarizer layer disposed on the first substrate;
a second polarizer layer disposed on the second substrate; and
a first liquid crystal layer disposed in the first gap between the first substrate and the second substrate, wherein liquid crystal molecules in the first liquid crystal layer have a first liquid crystal retardation;
a second LCD panel, comprising:
a third substrate and a fourth substrate spaced apart from each other, forming a second gap between the third substrate and the fourth substrate, wherein the third substrate is located between the second substrate of the first LCD panel and the fourth substrate, and the second substrate of the first LCD panel is located between the first substrate of the first LCD panel and the third substrate;
a color conversion layer disposed on the third substrate facing the fourth substrate;
a second TFT layer disposed on the fourth substrate facing the third substrate;
a third polarizer layer disposed on the color conversion layer facing the fourth substrate;
a fourth polarizer layer disposed on the fourth substrate; and
a second liquid crystal layer disposed in the second gap between the third substrate and the fourth substrate, wherein liquid crystal molecules in the second liquid crystal layer have a second liquid crystal retardation, and the second liquid crystal retardation is different from the first liquid crystal retardation.

2. The display cell structure of claim 1, further comprising a diffusion film disposed on the fourth polarizer, wherein the second LCD panel is located between the diffusion film and the first LCD panel.

3. The display cell structure of claim 1, wherein the first liquid crystal retardation is in a range between 300 nm to 380 nm.

4. The display cell structure of claim 1, wherein the second liquid crystal retardation is in a range between 240 nm to 280 nm.

5. The display cell structure of claim 1, wherein the color conversion layer is formed with a wavelength converting material configured to absorb light at a first wavelength and emit light at a second wavelength different from the first wavelength.

6. The display cell structure of claim 5, wherein the wavelength converting material is a phosphor material or a quantum dot material.

7. The display cell structure of claim 1, wherein the third polarizer layer is a carbon nano-tube polarizer layer.

8. The display cell structure of claim 7, wherein the carbon nano-tube polarizer layer comprises cylindrical carbon nano-tube molecules, and each of the cylindrical carbon nano-tube molecules aligns in an identical cylindrical direction.

9. The display cell structure of claim 8, wherein the carbon nano-tube polarizer layer comprises auxiliary liquid crystal molecules, and a ratio of a weight percentage of the cylindrical carbon nano-tube molecules to the auxiliary liquid crystal molecules in the second liquid crystal layer is in a range of 5% to 10%.

10. A display device, comprising:
   a display cell structure of claim 1; and
   a blue light source configured to emit blue light toward the second LCD panel.

11. The display device of claim 10, wherein the blue light source comprises:
   a plurality of blue light emitting diodes emitting the blue light; and
   a reflection sheet reflecting the blue light toward the second LCD panel.

12. A display device, comprising:
   a first liquid crystal display (LCD) panel, comprising:
      a first substrate and a second substrate spaced apart from each other, forming a first gap between the first substrate and the second substrate;
      a color filter layer disposed between the first substrate and the second substrate;
      a first TFT layer disposed on the second substrate facing the first substrate;
      a first polarizer layer disposed on the first substrate;
      a second polarizer layer disposed on the second substrate; and
      a first liquid crystal layer disposed in the first gap between the first substrate and the second substrate, wherein liquid crystal molecules in the first liquid crystal layer have a first liquid crystal retardation;
   a second LCD panel, comprising:
      a third substrate and a fourth substrate spaced apart from each other, forming a second gap between the third substrate and the fourth substrate, wherein the third substrate is located between the second substrate of the first LCD panel and the fourth substrate, and the second substrate of the first LCD panel is located between the first substrate of the first LCD panel and the third substrate;
      a color conversion layer disposed on the third substrate facing the fourth substrate;
      a second TFT layer disposed on the fourth substrate facing the third substrate;
      a third polarizer layer disposed on the color conversion layer facing the fourth substrate, wherein the third polarizer layer is a carbon nano-tube polarizer layer;
      a fourth polarizer layer disposed on the fourth substrate and facing an opposite side to the third substrate; and
      a second liquid crystal layer disposed in the second gap between the third substrate and the fourth substrate, wherein liquid crystal molecules in the second liquid crystal layer have a second liquid crystal retardation.

13. The display device of claim 12, further comprising:
   a plurality of blue light emitting diodes emitting blue light toward the second display panel.

14. The display device of claim 12, wherein the second liquid crystal retardation is different from the first liquid crystal retardation.

15. The display device of claim 12, wherein the color conversion layer is formed with a wavelength converting material configured to absorb light at a first wavelength and emit light at a second wavelength different from the first wavelength.

16. The display device of claim 12, wherein the carbon nano-tube polarizer layer comprises cylindrical carbon nano-tube molecules, and each of the cylindrical carbon nano-tube molecules aligns in an identical cylindrical direction.

* * * * *